United States Patent
Leber

(10) Patent No.: US 10,224,699 B2
(45) Date of Patent: Mar. 5, 2019

(54) BULLET-RESISTANT ELECTRICAL INSTALLATION

(71) Applicant: Siemens Aktiengesellschaft, Munich (DE)

(72) Inventor: Gerald Leber, Grosspesendorf (AT)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/509,135

(22) PCT Filed: Sep. 17, 2014

(86) PCT No.: PCT/EP2014/002516
§ 371 (c)(1),
(2) Date: Mar. 6, 2017

(87) PCT Pub. No.: WO2016/041566
PCT Pub. Date: Mar. 24, 2016

(65) Prior Publication Data
US 2017/0279251 A1    Sep. 28, 2017

(51) Int. Cl.
*H05K 5/00* (2006.01)
*H02B 1/46* (2006.01)
*H01F 27/02* (2006.01)
*F41H 5/24* (2006.01)
*H01F 27/12* (2006.01)
(Continued)

(52) U.S. Cl.
CPC ............... *H02B 1/46* (2013.01); *F41H 5/24* (2013.01); *H01F 27/02* (2013.01); *H01F 27/12* (2013.01); *H02B 1/56* (2013.01); *H03H 7/18* (2013.01); *H05K 5/00* (2013.01)

(58) Field of Classification Search
None
See application file for complete search history.

(56) References Cited

U.S. PATENT DOCUMENTS 3,801,727 A * 4/1974 Wilkinson ............. H01F 27/02
174/142
4,350,838 A * 9/1982 Harrold ................. H01F 27/18
165/104.33
(Continued)

FOREIGN PATENT DOCUMENTS

DE    36 33 349 A1    4/1988
DE    37 29 048 A1    3/1989
(Continued)

OTHER PUBLICATIONS

Office Action dated Feb. 28, 2018 issued in the corresponding Australian Patent Application No. 2014406227.
(Continued)

Primary Examiner — Courtney Smith
(74) Attorney, Agent, or Firm — Cozen O'Connor

(57) ABSTRACT

An electrical installation, in particular a transformer, phase shifter or inductor, which includes a fluid-filled tank having side walls, wherein, for protection against bombardment and/or fragmentation effects, the side walls are formed in a bullet-resistant manner and are made of a material having a traction strength of greater than 1000 MPa, or wherein a bullet-resistant reinforcement made of such a material is provided, the outer side of which envelope the side walls.

18 Claims, 6 Drawing Sheets

(51) Int. Cl.
*H02B 1/56* (2006.01)
*H03H 7/18* (2006.01)

(56) References Cited

U.S. PATENT DOCUMENTS

| | | | | |
|---|---|---|---|---|
| 4,453,197 | A * | 6/1984 | Burrage | H01F 27/02 |
| | | | | 174/17 LF |
| 4,589,587 | A * | 5/1986 | Kanis | H01F 41/00 |
| | | | | 228/138 |
| 4,613,922 | A * | 9/1986 | Bachmann | H05F 3/02 |
| | | | | 361/215 |
| 5,269,436 | A * | 12/1993 | Bachmann | B29C 63/0021 |
| | | | | 220/565 |
| 5,326,606 | A | 7/1994 | Labock | |
| 5,527,988 | A * | 6/1996 | Hernandez | H01F 27/02 |
| | | | | 174/17 LF |
| 7,435,037 | B2 * | 10/2008 | McKinzie, II | C07C 4/02 |
| | | | | 405/130 |
| 9,244,469 | B2 | 1/2016 | Vaughn et al. | |
| 2005/0144900 | A1 | 7/2005 | Hallissy et al. | |
| 2007/0092346 | A1 * | 4/2007 | Kuziw | B08B 17/00 |
| | | | | 405/302.6 |
| 2011/0272319 | A1 | 11/2011 | Koivuluoma et al. | |
| 2011/0273255 | A1 * | 11/2011 | Thompson | H01F 27/02 |
| | | | | 336/94 |
| 2017/0267447 | A1 * | 9/2017 | Schramm | B65D 88/78 |

FOREIGN PATENT DOCUMENTS

| | | |
|---|---|---|
| DE | 86 09 852 U1 | 8/1989 |
| DE | 100 02 630 A1 | 6/2001 |
| EP | 3195334 B1 | 7/2018 |
| RU | 2103466 | 1/1998 |
| RU | 2013153395 | 6/2015 |
| TW | 200944313 | 11/2009 |

OTHER PUBLICATIONS

Office Action dated Oct. 16, 2018 issued in Canadian Patent Application No. 2,961,407.

* cited by examiner

BULLET-RESISTANT ELECTRICAL INSTALLATION

CROSS-REFERENCE TO RELATED APPLICATIONS

This is a U.S. national stage of application No. PCT/EP2014/002516 filed 17 Sep. 2014.

BACKGROUND OF THE INVENTION

1. Field of the Invention

The invention generally relates to the technical field of electrical installations and, more particularly, to electrical transformers, phase shifters and inductors of high rated power, such as those commonly used in energy distribution networks.

2. Description of the Related Art

Electrical installations, such as transformers, inductors or switching devices, represent node points in an energy distribution network, and in times of crisis these node points can be potential targets of attack for destructive strikes from outside. Such strikes include, e.g., attacks front surrounding terrain by fire from small arms, explosive charges detonated in the vicinity of the electrical installation, or even grenade or bomb fragments. The side walls of a tank filled with fluid are particularly vulnerable, in this case. If these side walls are hit by bullets, depending on the intensity of the missile effect, a leak can occur. However, even if the tank remains tight, a pressure wave cars propagate in a liquid-filled tank, causing safety devices to shut down the installation. In both cases, the energy supply can be adversely affected by the attack.

DE 37 23 048 A1 discloses, for example, object protection for a transformer of high rated power, where the side walls of the transformer tank are internally reinforced with protective plates to protect against external mechanical effects. The protective plates are welded onto the side walls on the inside and consist of a special steel for cushioning fragments and missiles. One disadvantage here is that the protective reinforcement is weakened in the region of the welded seam. A further disadvantage is that, in the case of bullets, pressure waves propagate in the liquid-filled tank, which can result in the transformer being shut down by safety devices. The energy supply is then interrupted at least temporarily.

SUMMARY OF THE INVENTION

In view of the foregoing, it is an object of the present invention to protect an electrical installation in an energy distribution network, in particular a transformer or an inductor, such that the energy supply is not adversely affected even in the event of an attack using small arms or an explosive charge.

This and other objects and advantages are achieved in accordance with the invention by a method for upgrading an existing electrical installation and an electrical installation, in particular a transformer, a phase shifter or an inductor, comprising a fluid-filled tank having side walls, where, for protection against the effect of bullets and/or fragments the side walls are formed in a penetration-inhibiting manner and are made of a material having a tensile strength $R_m$ greater than 1000 MPa, or a penetration-inhibiting reinforcement made of such a material is provided and envelops the side walls on the outside.

The bullet-resistance can therefore be achieved by manufacturing at least the aide walls of the tank from, e.g., a steel having a tensile strength $R_m$ greater than 1000 MPa. However, the tank itself can be manufactured from conventional steel and externally enveloped by a reinforcement that exhibits this tensile strength. The tensile strength of materials is defined in DIN EN ISO 6892-1.

In accordance with a fundamental idea of the invention, the object protection is therefore achieved by a penetration-inhibiting embodiment of the tank or the reinforcement or armor. The fluid in the tank can be a cooling fluid or insulation fluid, such as transformer oil, or a gas in a switching installation. The term bullet-resistant is understood to mean the resistance of a material or a construction to withstand penetration by a missile under defined conditions. A definition of missile-resistance is provided in the American standard UL 742 (Ratings of Bullet Resistant Materials) Level 1 through Level 10, for example. This corresponds to test levels between 1 and 14 as defined in the 2006 general test guidelines of the "Vereinigung der Prüfstellen für angriffhemmende Materialien und Konstruktionen" (VPMA APR 2006) [Association of Test Centers for Attack-Inhibiting Materials and Constructions]. Test level 1 starts with a caliber .21 lr, a missile mass of 2.6 g and a missile energy of approximately 160 J (Joules). Test level 14 comprises a caliber 14.5×114, a missile mass of approximately 64 g and a missile energy of 26,308 J (Joules). Corresponding levels between BR1 and BE7 are defined in the European standard DIN EN 1063. Within the meaning of the invention, this balistically defined bullet-inhibiting action against a handgun and/or rifle applies analogously to the fragmentation action of an explosive structure that detonates in the vicinity of the installation. In other words, the protective measure in accordance with the invention comprises at least a sphere of action specified in the standards cited above. In other words, the effect of bullets within such a sphere does not result in a leak occurring in the tank of the electrical installation. A protective measure within this sphere of action (Level 1 to 10, or test level 1-14) can be realized at reasonable cost. In principle, protection of an electrical installation against bullets can also extend beyond this sphere of action.

In accordance with the invention, a material having a tensile strength of greater than 1000 MPa (megapascal) is used for the protective measure. A high tensile strength renders the material particularly suitable for reinforcement or armor. Such a material having high tensile strength can be a metallic or non-metallic material, such as a polymer material, a carbon-fiber-reinforced synthetic material, a material that is based on polyethylene, or aramide fibers. Known trademarks for aramide fibers include, e.g., Nomex® and Kevlar® by DuPont. In this case, the synthetic material fibers can be woven together and realized in different ways. A sandwich construction that combines metal and non-metal (a synthetic material, a carbon-fiber fleece or similar) is also suitable as a material for the penetration-inhibiting reinforcement. The advantage of a polymer is the comparatively light weight, though the cost is higher.

In a preferred-embodiment, the reinforcement envelops the side walls of the tank all-round at a distance, and is fastened to the tank via a plurality of fastening elements. By virtue of the penetration-inhibiting reinforcement being fastened to the installation at a distance via a plurality of support points, no effect occurs at a specific point of the tank wall, and an energy-absorbing action is instead achieved. The missile energy that strikes the outside of the reinforcement is not transferred to the liquid inside the tank directly at the point of impact, and instead only a portion of this energy is transferred respectively over a plurality of support points in a distributed manner. The pressure wave spreading in the cooling and insulation liquid is consequently less intense. If the pressure wave hits a protective device (e.g., a Buchholz protective device or a decompression valve), there is less risk that it will result in an unwanted shutdown of the installation. By virtue of fastening the reinforcement to the outside rather than the inside of the tank, a range of advantages are produced. Firstly, the protection can be assembled subsequently. Secondly, the armor does not initially increase the external dimensions of the installation. Additionally, the armor plates can be manufactured and transported separately. For large power transformers in particular, it is particularly advantageous for the armor to be assembled once at the operating site, thereby facilitating the transportation through urban areas and tunnels, the limits of the transportation already being reached today as a result of the dimensions.

It is also advantageous that a transformer or inductor that is already in operation can be upgraded with comparatively little technical effort. The attachment of the armor to the outside can easily be effected at existing strengthening elements and tank ribs.

With regard to the manufacturing costs, in an advantageous embodiment, the bullet-proof reinforcement is made of a plate consisting of a carbon-rich hardened steel, where the plate has a tensile strength $R_m>1000$ megapascal. It is advantageous in this case for the plate to have a Brinell hardness of 300-500. If a corresponding protective coating is applied, the protective shell made of plates can also be weather-resistant. Results of ballistic trials have shown that a VPAM test level 12 and even higher can readily be realized at reasonable cost for a power transformer.

In a particularly preferred embodiment, the penetration-inhibiting reinforcement can be made of individual plates or panels, where adjacent panels overlap each other. As a result of the armor being made of individual parts, the dimensions are reduced and handling and transportation are easier. Stock keeping is likewise simpler. In the event of actual bullets or effects of fragments, damaged panels can easily be replaced. The individual plates can be multilayered and comprise metallic and non-metallic layers.

The panels can advantageously be so assembled as to stand vertically lengthways and parallel to each other. As a result, fewer fastening elements are required between panel and installation or transformer.

In a particularly preferred embodiment, each panel has a profile, e.g., a U, S, Z, V or C profile, where adjacent limbs interlock. A profile increases the moment of resistance and inertia. In comparison with a welded seam, there is no material weakening and no distortion. In the case of bullets from automatic weapons, the "multi-hit" properties are improved. In this case, the U, S, Z, V or C profile can be so designed in cross section that the limb parts of such a profile form an obtuse angle with the connecting center part. The arrangement of the panels in the assembled state is selected so that adjacent panels interlock with their limbs. This interlocking ensures that no missile or fragment structures can penetrate between panels and damage the tank wall. In order to limit the emission of operating noise, advantage can be gained from ensuring that adjacent panels do not abut each other directly, and a gap is left between them instead.

In a preferred embodiment, a bracket part is used on the tank side and/or panel side to fasten each panel, where the bracket parts are each connected via a spring element. The spring element has an elastically yielding action, whereby the kinetic energy of a striking missile or a fragment is not carried directly into the interior of the liquid-filled tank. The amplitude of the shock wave propagating in the cooling or insulation liquid is therefore lower. Unwanted triggering of a safety device is prevented.

An economical design of a fastening device can be constructed such that a spring element, e.g., either a metallic spring or an elastomeric material, is arranged between the two bracket parts. A rubber can be fastened by adhesion to corresponding metal parts on both sides by vulcanization. Such vibration-damping metal-rubber-metal components are commercially available.

Depending on the embodiment of the transformer or the inductor, domes with high-voltage ducting and/or other parts of the installation may be arranged on the tank lid for the purpose of electrical connections. In order to also protect these installation parts, to the extent that they lie in the field of projection or field of view of the surrounding terrain of the installation, provision can be made for the vertically arranged panels at their upper ends to extend beyond these domes and/or installation parts. As a result, these high-lying installation parts are also protected against bullets and the effect of fragments from the surrounding terrain.

Embodiments of transformers also exist in which the lid of the tank supports a comparatively large expansion vessel, which extends beyond the ground plan of the transformer tank at the side. In order to also protect this expansion vessel against bullets and the effect of fragments, in a particular embodiment of the invention the surface of the expansion vessel is likewise surrounded by a penetration-inhibiting reinforcement or armor, at least to the extent that no damage is sustained in the event of an attack from the surrounding terrain.

It is also an object of the invention to provide a method for upgrading an electrical installation, e.g., a transformer, a phase shifter or an inductor. In this case, the aide walls of an installation that is already in operation are fitted with a penetration-inhibiting reinforcement. The bullet-inhibiting reinforcement is fastened to the transformer or inductor as an upgrade by means of fastening elements, a distance being maintained all-round between side walls and reinforcement. The intermediate space formed thereby can be filled or lined with a damping material for the purpose of damping operating noise.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In order to explain the invention further, reference is made in the following part of the description to drawings from which further advantageous embodiments, details and developments of the invention can be derived based on a non-restrictive exemplary embodiment, in which.

DETAILED DESCRIPTION OF THE EXEMPLARY EMBODIMENTS

Figure 1:
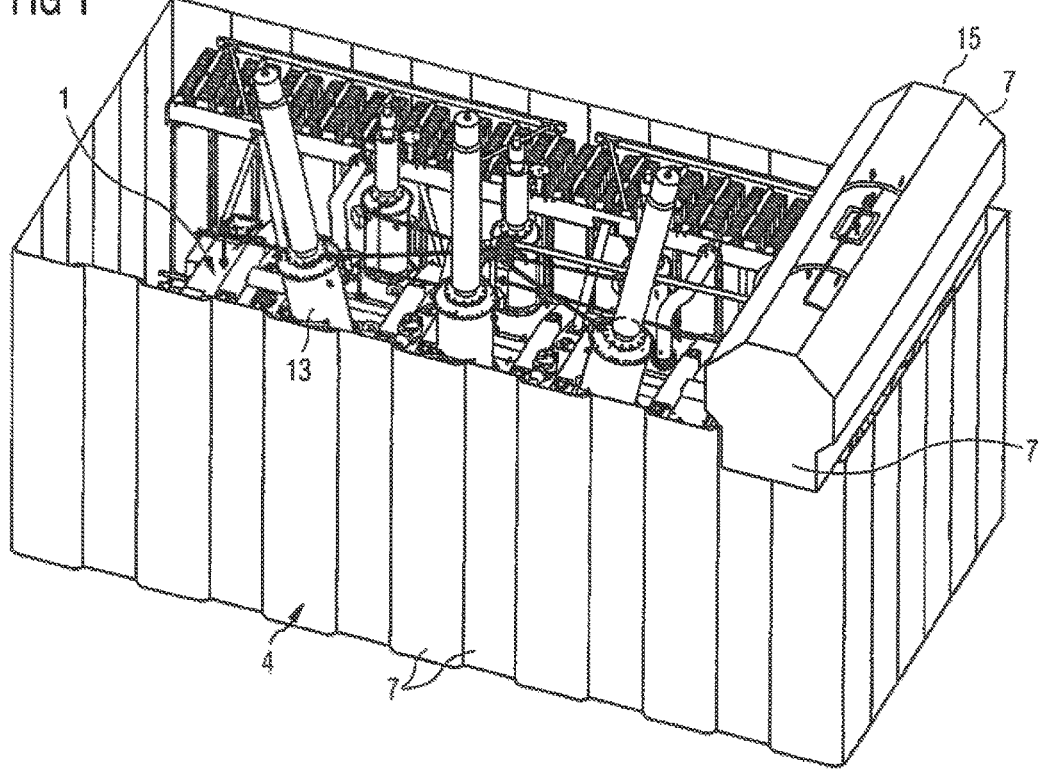
FIG. 1 shows a perspective view of a transformer whose tank side walls are enveloped by a penetration-inhibiting reinforcement in accordance with the invention.

FIG. 1 shows a perspective view of a bullet-resistant electrical installation, illustrated using the example of a power transformer 1. Here, the power transformer 1 is standing on a base which is not illustrated in detail. In accordance with the illustrated exemplary embodiment, the penetration-inhibiting reinforcement or armor 4 envelope the side walls of the power transformer 1 and extends down to the ground. With respect to its structure and dimensions, the armor 4 is constructed to withstand a threat of bullets or fragments coming from the surrounding terrain, such that all parts of the installation are protected. In the exemplary embodiment illustrated in FIG. 1, this reinforcement or armor 4 consists of individual plates or panels that form a vertical protective wall. This row of successive plates 7 completely surrounds the installation 1, and form a protective shell that provides protection against bullets and effects of fragments. The individual panels are made of steel plate whose tensile strength $R_m$ is >1000 megapascal. The plate thickness complies with the intended rating (UL 752) or test level (VPAM APR 2006). The length of the individual panels 7 is dimensioned such that any effect of bullets or fragments coming from the surrounding terrain is not able to inflict damage on the transformer 1 or those installation parts situated on the tank lid. As illustrated in FIG. 1, the individual panels 7 therefore extend at their upper ends beyond the installation components arranged on the tank lid, such as lower parts of high-voltage ducts and domes 10 or other installation parts of the power transformer 1.

Figure 2:
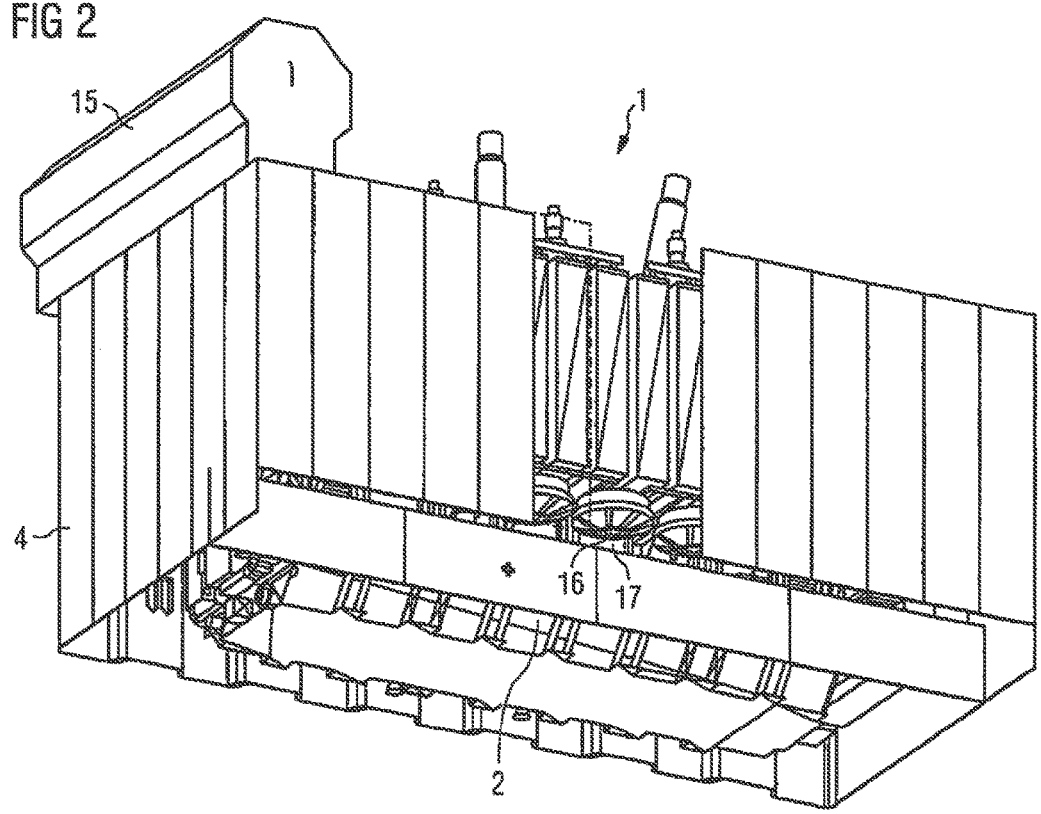
FIG. 2 shows the transformer of FIG. 1, in a viewing angle obliquely from below to the radiator attached at the front side.

FIG. 2 shows the power transformer 1 as illustrated in FIG. 1, likewise in a perspective view but this time seen from behind and obliquely below. For the removal of operating heat, the power transformer 1 has a radiator 16 on a longitudinal side. The view in FIG. 2 is directed at this radiator 16 from obliquely below. The radiator 16 is likewise armored on the outside and protected against destructive lateral effects. Although a vertical cooling channel in the region of the radiator 16 is left open for the purpose of cooling, this is also externally screened by panels 7 in a projectile-proof and fragment-proof manner.

Figure 3:
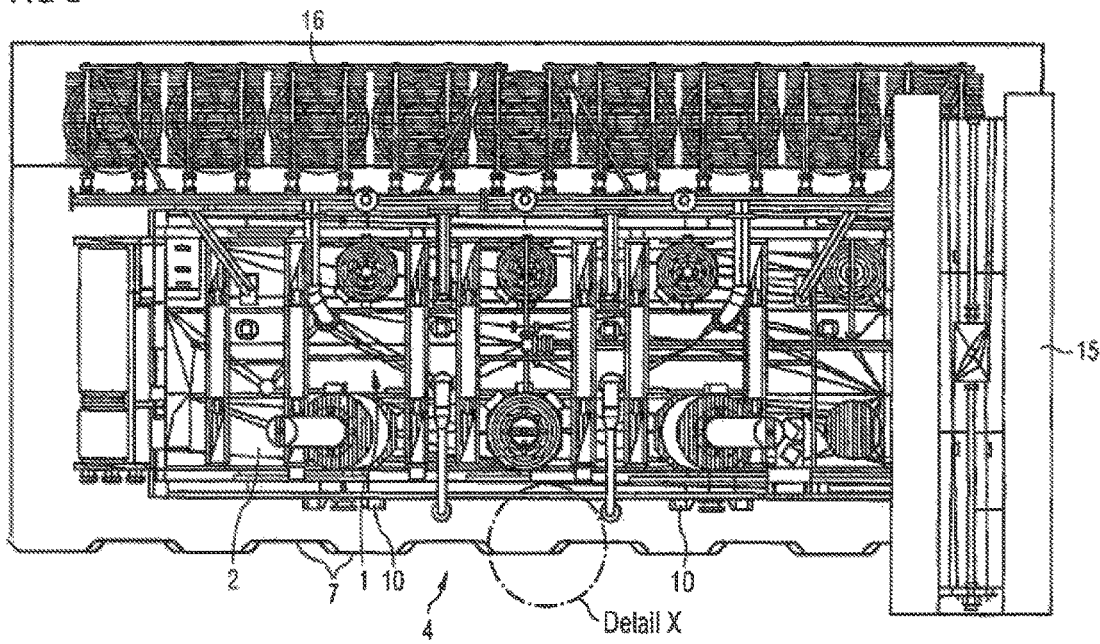
FIG. 3 shows the transformer of FIG. 1, in a plan view.

FIG. 3 shows the power transformer 1 of FIG. 1 in a plan view. The radiator 16 is situated on a long side wall of the transformer 1. The connection to the energy supply network is made via high-voltage ducts and domes 10 that are arranged on the roof of the tank 2. An expansion vessel 15 is also situated on the lid of the tank 2. The expansion vessel 15 has the shape of a cylinder. The lateral surface of the expansion vessel 15 lies approximately parallel with the plane of the tank lid. An end face of the cylinder extends beyond the ground plan of the transformer tank at the side. As illustrated in the drawing of FIG. 3, not only the tank 2 but also the surface of the expansion vessel 17, i.e., its lateral surface and end faces, is covered by armor 4. This armor 4 can likewise be composed of individual panels 7. The panels 7 are arranged vertically and horizontally in this case.

Figure 4:
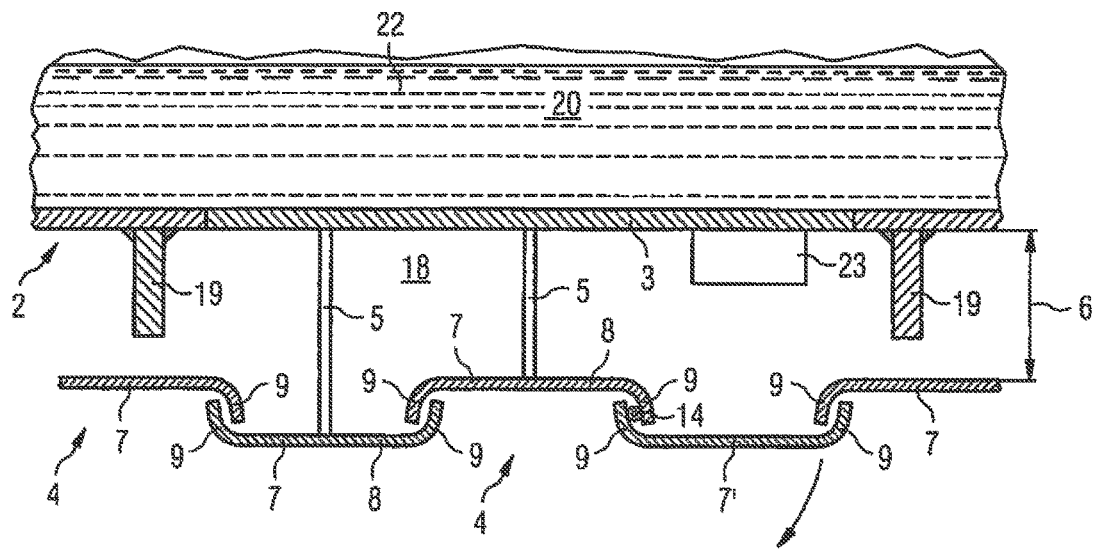
FIG. 4 shows an embodiment of the invention, in which the reinforcement is formed by individual vertically arranged panels as per detail X from FIG. 3.

FIG. 4 shows a detail X of FIG. 3 in a magnified illustration. A preferred profile and arrangement of the individual panels 7 is depicted by way of example. The panels 7 are arranged vertically and one beside the other. The panels 7 overlap each other laterally. Each panel 7 is connected by a plurality of fastening elements 5 to the tank 2 or to a side wall 3 of the tank 2. The fastening can be anchored either directly to the tank wall 3, or to ribs or strengthening elements 19 of the tank 2. The individual panels of the reinforcement 4 are arranged so as to surround the tank wall 3 at a distance 6. The fastening elements 5, which are described in greater detail below, are situated in a circumferential intermediate space 18 that is delimited by the tank wall 3 and the facing inner side of the panels 9. As illustrated in FIG. 4, in a preferred embodiment, the panels have a U-shape profile consisting of two limb parts 9 and a connecting part 8. The limb parts 3 are bent up relative to the connecting part 8 that connects them, and with the connecting part 8 each form an obtuse angle. In this way, the arrangement is selected such that adjacent panels 7 present a mirror image to each other with respect to their cross section. Limb parts 9 interlock in this arrangement. A gap is left in this case. The gap and the shape of the curve of the limb 9 are dimensioned such that a quasi labyrinth is formed. This labyrinth prevents penetration, in the region of the point of impact, by a bullet or fragment body that has been shot from the external environment 21. If a fragment or a projectile strikes one of the panels 7, the attachment of the fastening elements 5 ensures that the energy of the missile is distributed over a plurality of fastening points. Each panel 7 is supported by a plurality of support points on the tank 2. The pressure wave that spreads in the cooling and insulation liquid 22 in the tank interior 20 is therefore less intense. It is thereby possible to avoid an unintentional shutdown of the installation due to the effects of bullets or an external explosion. The supply of electrical energy in a distribution network is maintained in the event of a destructive attack. If panels are seriously damaged, they can easily be replaced.

The illustration of FIG. 4 also shows a hinge 14, whereby the panel 7' can be swiveled (rotated) away from the transformer tank 2 as per the arrow. By virtue of this ability to swivel one or more of the panels 7', equipment or externally mounted parts 23 that are situated in the intermediate space 18 between reinforcement 4 and tank wall 3 can be accessible from the outside. Such equipment 23 may comprise a display unit, a switch unit or a connection device, for example.

A panel 7 can have a width ranging from 20 cm to a number of meters. The hinge 1 can extend over the whole height or only a section of the height.

Figure 5:
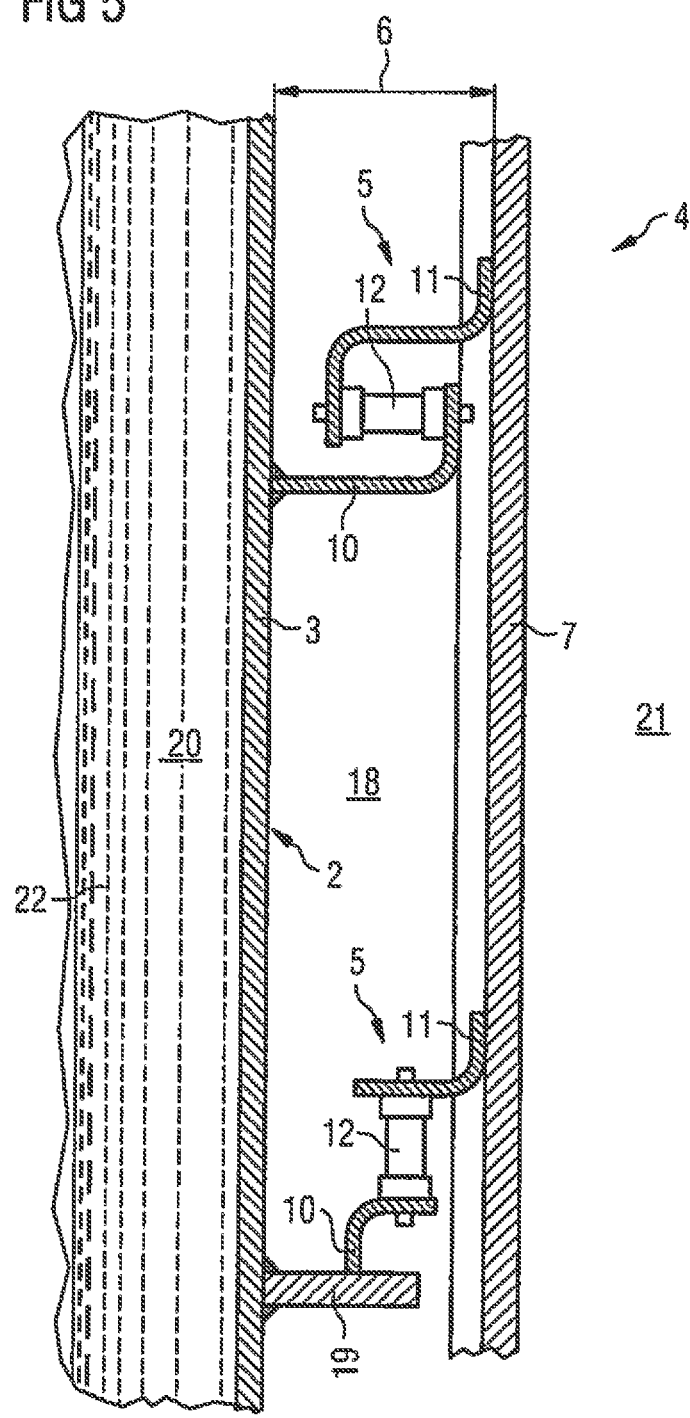
FIG. 5 shows an exemplary embodiment of a fastening of the panels to the tank in accordance with the invention.

FIG. 5 shows a possible configuration of the fastening device 5 for fastening the panels to the tank 2. The panels 7 are fastened vertically and at a distance 6 relative to the tank wall 3. An intermediate space 18 is provided between the tank wall 2 and a panel 7. By way of example, a fastening with two fastening elements 5 is illustrated in FIG. 5. Here, the upper and lower fastening elements 5 consist essentially of a metal-rubber-metal component that is fastened by a bracket 10 on the tank side and a bracket 11 on the panel side to the tank wall 2 and the panel 7, respectively. In the exemplary embodiment illustrated here, the upper fastening structure 5 is arranged horizontally and the lower fastening structure 5 is arranged vertically. This makes assembly easier, because the panel 7 is hooked on at the bottom and then fastened at the top by a screw connection, for example.

The panel 7 is thereby isolated from the tank 2 with respect to vibration. A spring steel can also be used instead of rubber for isolation and fastening.

In order to reduce operating noise, the circumferential intermediate space 18 illustrated in FIGS. 4 and 5 can be filled with a noise-damping material.

Although the invention is illustrated and described in detail above with reference to preferred exemplary embodiments, the invention is not restricted to the examples disclosed herein. Other variations may be derived therefrom by a person skilled in the art, without thereby departing from the scope of the invention.

For example, depending on the size of a power transformer or an inductor, it may be advantageous to fasten each panel 7 to the tank 2 with a plurality of fastening points. It should be appreciated the assisting strengthening elements or ribs on the tank 2 can be used or shared for the purpose of fastening. Suitable fastening means can preferably be provided already via a welded connection during the manufacture of the tank. In the exemplary embodiment illustrated, a panel 7 consists of a single steel plate having a high tensile strength. However, non-metallic materials can also be used to keep any effect of bullets or explosion away from the tank. It is conceivable for the panels 7 to be sandwich panels, made of a composite material of metal and synthetic material. It is also conceivable to solely use a polymer material for the armor 7, this consisting of, e.g., individual panels 7 of synthetic material. The armor 4 is then lighter in weight but also more expensive. For example, the synthetic material panels 7 can be made of the aramide fiber Kevlar®, or a high-performance polyethylene (HPDE) or another suitable polymer.

The invention is not restricted to the power transformer described above, but is applicable generally to electrical installations in energy supply networks, e.g. high-voltage switches which are operated using protective gas or similar installations.

Figure 6:
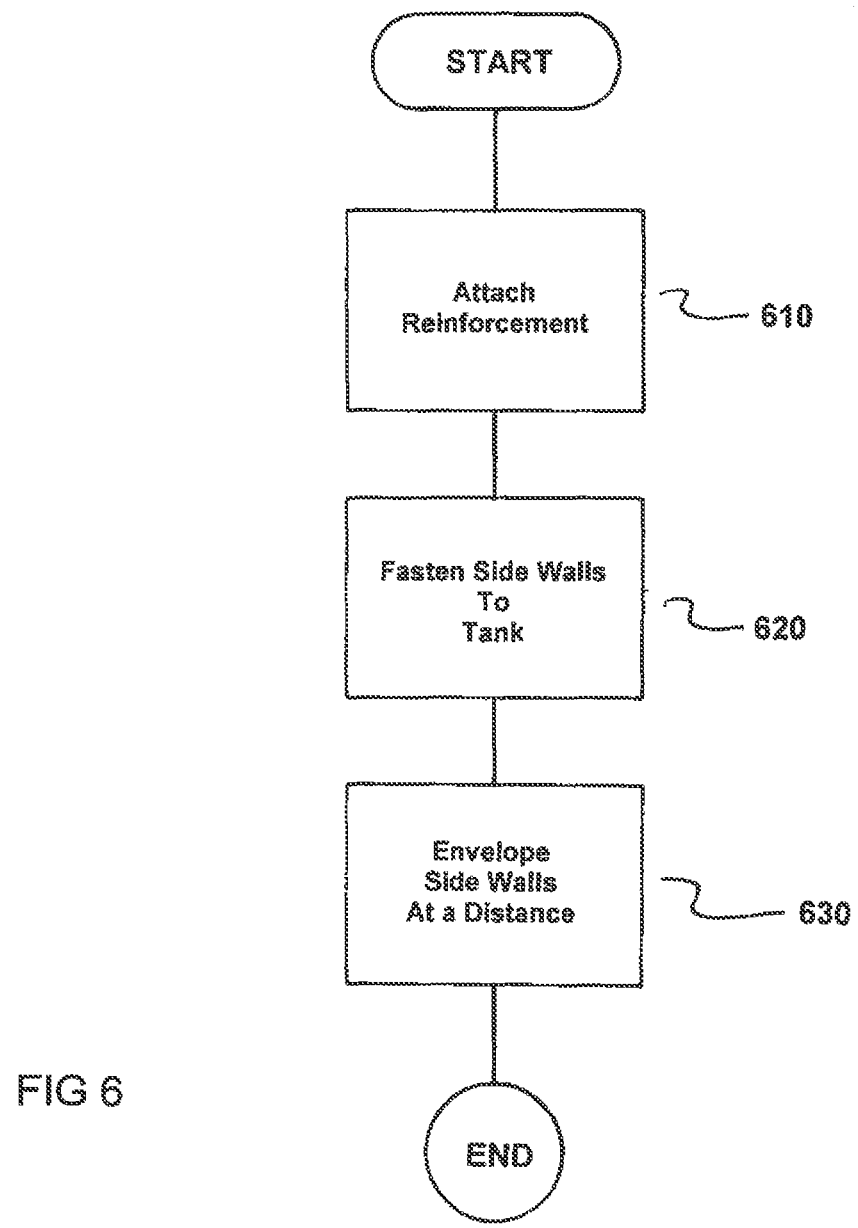
FIG. 6 is a flowchart of the method in accordance with the invention.

FIG. 6 is a flowchart of a method for upgrading an electrical installation comprising a liquid-filled tank (2) having side walls (3). The method comprises attaching a penetration-inhibiting reinforcement (4) to the side walls (3), as indicated in step 610. Next, the side walls (3) are fastened to the tank (3) via fastening elements (5), as indicated in step 620. The side walls (3) are now enveloped all-round at a distance (6), such that at least the liquid-filled tank (2) and, if applicable, installation parts arranged on a lid of the liquid-filled tank are protected against effect from bullets and fragments, as indicated in step 630.

While there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An electrical installation, comprising:
a fluid-filled tank having side walls;
wherein one of:
(i) the side walls are formed in a penetration-inhibiting manner and are made of a material having a tensile strength greater than 1000 MPa for protection against effects of at least one of bullets and fragments and
(ii) a penetration-inhibiting reinforcement made of the material having the tensile strength greater than 1000 MPa envelops the side walls at an outside of the tank for protection against the effects of at least one of the bullets and fragments; and
wherein the penetration-inhibiting reinforcement envelops the side walls all-round at a spaced apart distance from the tank and is fastened to the tank via a plurality fastening elements.

2. The electrical installation as claimed in claim 1, wherein the penetration-inhibiting reinforcement is formed of panels; and wherein adjacent panels overlap each other.

3. The electrical installation as claimed in claim 2, wherein the panels are arranged vertically or horizontally lengthways.

4. The electrical installation as claimed in claim 2, wherein each panel has a cross-sectional profile with limbs; and wherein adjacent limbs interlock.

5. The electrical installation as claimed in claim 3, wherein each panel has a cross-sectional profile with limbs; and wherein adjacent limbs interlock.

6. The electrical installation as claimed in claim 3, wherein each fastening element of the plurality fastening elements has a spring element.

7. The electrical installation as claimed in claim 4, wherein each fastening element of the plurality fastening elements has a spring element.

8. The electrical installation as claimed in claim 6, wherein each fastening element of the plurality fastening elements has a bracket which is fastened to the tank and a further bracket which is fastened to the reinforcement; and wherein the bracket and the further bracket are connected via the spring element.

9. The electrical installation as claimed in claim 6, wherein the spring element is made of an elastomeric material which is adhesively fastened to the bracket and the further bracket.

10. The electrical installation as claimed in claim 8, wherein the spring element is made of an elastomeric material which is adhesively fastened to the bracket and the further bracket.

11. The electrical installation as claimed in claim 2, wherein the tank has a tank lid upon which at least one of domes and other installation parts are arranged; and wherein the panels extend beyond at least one of (i) the domes at their upper ends and (ii) other installation parts at their upper ends.

12. The electrical installation as claimed in claim 2, wherein the tank has a tank lid, upon which is arranged a cylindrical expansion vessel whose surface is enveloped via the panels.

13. The electrical installation as claimed in claim 2, wherein the reinforcement comprises at least one panel which is mounted on a hinge and which can be swiveled towards the external environment.

14. The electrical installation as claimed in claim 2, further comprising:

a noise-damping material arranged in an intermediate space formed between the side wall and the reinforcement.

15. The electrical installation as claimed in claim 1, wherein the electrical installation is one of a transformer, a phase shifter and an inductor.

16. A method for upgrading an electrical installation comprising a liquid-filled tank having side walls, the method comprising:
   attaching a penetration-inhibiting reinforcement to the side walls, fastening the side walls to the tank via fastening elements; and
   enveloping the side walls all-round at a distance, such that at least the liquid-filled tank and installation parts arranged on a lid of the liquid-filled tank are protected against effects from bullets and fragments.

17. The method as claimed in claim 15, wherein a noise-damping material is arranged in an intermediate space formed by the penetration-inhibiting reinforcement which is attached to the side wall at the distance.

18. The method as claimed in claim 15, wherein the electrical installation is one of a transformer, a phase shifter and an inductor.

* * * * *